United States Patent
Jung

[11] Patent Number: 6,145,900
[45] Date of Patent: Nov. 14, 2000

[54] GUN-SHAPED TWEEZER HAVING A NON-ROTATABLE HEAD/BODY CONNECTION FOR ADSORBING A SEMICONDUCTOR WAFER

[75] Inventor: Yui-kun Jung, Suwon, Rep. of Korea

[73] Assignee: Samsung Electronics Co., Ltd., Suwon, Rep. of Korea

[21] Appl. No.: 09/301,540

[22] Filed: Apr. 29, 1999

[30] Foreign Application Priority Data

May 11, 1998 [KR] Rep. of Korea ............... 98-16777

[51] Int. Cl.7 .................................... B25J 15/06
[52] U.S. Cl. ............................................ 294/64
[58] Field of Search ................ 294/64.1, 64.2; 29/740, 743, 758; 118/500, 503; 285/7, 31–33, 145.1, 145.4, 292.1, 302, 328, 330, 332.4; 403/109.1, 109.2, 359, 360, 363, 377, 383

[56] References Cited

U.S. PATENT DOCUMENTS

| | | |
|---|---|---|
| 1,302,028 | 4/1919 | Fuchs et al. .................... 294/64.1 |
| 2,280,658 | 4/1942 | Miller ............................. 294/64.2 |
| 2,500,720 | 3/1950 | van der Heem ............... 285/328 X |
| 2,922,873 | 1/1960 | Bibbero et al. ............... 294/64.1 X |
| 3,071,402 | 1/1963 | Lasto et al. .................... 294/64.1 |
| 3,671,060 | 6/1972 | Kyburz .......................... 285/328 X |
| 5,141,258 | 8/1992 | Stine ............................. 285/302 X |
| 5,193,776 | 3/1993 | Nagai et al. .................. 294/64.1 X |
| 5,213,385 | 5/1993 | Nagai et al. .................. 294/64.1 |
| 5,433,551 | 7/1995 | Gordon .......................... 403/377 |
| 5,624,139 | 4/1997 | Kooten ............................ 285/31 |

*Primary Examiner*—Johnny D. Cherry
*Attorney, Agent, or Firm*—Jones Volentine, LLP

[57] ABSTRACT

A tweezer for adsorbing a semiconductor device allows easy and safe handling of the wafer by preventing rotation of the tweezer due to the weight of a wafer adsorbed off-center, and the breakage of the wafer caused thereby. The tweezer has a gun-shaped body, including a handle having a first vacuum line, and a barrel connected to the handle, the first vacuum line extending through the barrel. The first vacuum line is opened and closed by a trigger and shutter. A head is non-rotatably attached to the barrel, the head having a second vacuum line connected to the first vacuum line for adsorbing the wafer by the vacuum supplied inside the second vacuum line.

13 Claims, 7 Drawing Sheets

GUN-SHAPED TWEEZER HAVING A NON-ROTATABLE HEAD/BODY CONNECTION FOR ADSORBING A SEMICONDUCTOR WAFER

BACKGROUND OF THE INVENTION

1. Field of the Invention

The present invention relates to a tweezer for adsorbing a semiconductor wafer, and more particularly, to a gun-shaped tweezer having a non-rotatable connection between its head and its body, for safely handling the semiconductor wafer.

2. Background of the Related Art

Generally in the semiconductor device fabrication process, an operator uses a tweezer for handling a semiconductor wafer in order to prevent the wafer from being contaminated.

A conventional tweezer 2 for adsorbing a semiconductor wafer, as shown in FIG. 1, comprises a body 10 with straight-shape, and a head (not numbered) being composed of a neck 20 and a pad 22 in which the body 10 and the head are connected by a connecting means. Inside the straight-shaped body 10, as shown in FIG. 2, there is provided a first vacuum line 11; and inside the neck 20 of the head, there is provided a second vacuum line 15 which is in communication with the first vacuum line 11. As shown in FIG. 2, the body 10 and the neck 20 of the head are connected by a cylinder-shaped connecting part 13 having second vacuum line 15 therein, which is extended from the end of the neck 20, with a step formed at the junction between them. The cylinder-shaped connecting part 13 is inserted into the first vacuum line 11 of the body 10. Also, O-rings 12 are provided for sealing between the outer surface of the connecting part 13 and the inner surface of the first vacuum line 11.

As shown in FIG. 1, there is provided a vacuum hose 18 connecting the end of the first vacuum line 11 to a vacuum source (not shown) for carrying out pumping operations.

A shutter 16 is provided on a certain upper portion of the body 10 for closing the first vacuum line 11 by means of a certain pressure. A vacuum switch 17, which is movably fixed by a fixing screw 14, is provided on an upper portion of the body 10 for applying pressure to the shutter 16.

The pad 22 has a space therein (not shown) to which a pumping force is transmitted via the second vacuum line 15 provided inside the neck 20, and a plurality of vacuum holes 24 are provided on the top of the pad 22 for adsorbing a wafer by pumping the air outside the pad 22 by means of the pumping force transmitted via the second vacuum line 15 of the neck 20.

The operator supports the bottom of the body 10 of the tweezer 2 using his or her fingers, and holds the body 10 with his or her thumb. Then, the wafer is attached to the pad 22, and the air around the pad 22 is pumped out of the pad 22 via the vacuum holes 24 of the pad 22, the second vacuum line 15, the first vacuum line 11, and the vacuum hose 18, so that the wafer is adsorbed on the pad 22.

Next, the operator lifts the tweezer carrying the wafer, and takes a close look at the wafer to examine it for any defects.

Then, the operator moves the pad 22 having the wafer adsorbed thereon to the upper side of a cassette, and applies pressure to the vacuum switch 17 of the tweezer 2 using his or her index finger. Therefore, the pressure of the vacuum switch 17 is transmitted to the shutter 16 so that the first vacuum line 11 of the body 10 is closed thereby stopping the transmittal of the pumping force from the vacuum source.

The wafer adsorbed on the pad 22 is detached from the pad when the pumping force stops, and the wafer is mounted inside the cassette.

However, in the conventional tweezer for adsorbing a semiconductor wafer, the head comprising the pad 22 and the neck 20 is connected to the body 10 by inserting the cylindrical-shaped connecting part 13 connected to the neck 20 of the head into the first vacuum line 11 in the straight-shaped body 10.

Therefore, as shown in FIG. 3a, when a large-diameter wafer 30 is attached to the pad 22 at or near the center of the wafer, the wafer 30 can be easily handled. However, as shown in FIGS. 3b and 3c, when the wafer is attached to the pad at an off-centered position, the head comprising the pad 22 and the neck 20 tends to rotate relative to the body, because the weight of the wafer 30 is not evenly distributed about the center line of the body.

Therefore, the operator is forced to use a tool, or his or her hand, to stop the rotation of the head. Otherwise, the wafer 30 may fall to the floor and break.

Furthermore, it is difficult to handle large-diameter wafers, such as 8 inch and 12 inch wafers, when the operator has to apply pressure to the vacuum switch 17 on the body 10 with his or her index finger, while supporting the straight-shaped body 10 using his or her fingers and holding the body 10 with his or her thumb, because the force is dispersed over the operator's hand.

SUMMARY OF THE INVENTION

The present invention is directed to providing a tweezer for adsorbing a semiconductor wafer, which substantially overcomes one or more of the problems due to the limitations and disadvantages of the related arts.

One object of the present invention is to provide a tweezer for adsorbing a semiconductor wafer for safely handling the semiconductor wafer by preventing the head of the tweezer from rotating due to the weight of the wafer during a test, and for preventing wafer breakage and improving the reliability of the test.

Another object of the present invention is to provide a tweezer for adsorbing a large-diameter semiconductor wafer for safely handling the wafer.

To achieve these and other advantages and in accordance with the purpose of the present invention as embodied and broadly described, the tweezer for adsorbing a semiconductor wafer comprises a gun-shaped body, the gun-shaped body comprising a handle in which a first vacuum line for supplying vacuum is provided, and a barrel which is connected to the handle, the first vacuum line extending through the barrel, and the end of the barrel being connected to a head for adsorbing a wafer by vacuum; and an opening/closing means for selectively opening/closing the first vacuum line.

A plurality of slip-prevention protrusions are provided on the outer surface of the handle.

In addition, the opening/closing means comprises a trigger which is movably fixed at a lower side of the barrel by means of a fixing member, and a shutter for opening/closing the first vacuum line by pressure from the trigger.

In addition, the shutter comprises a head section, and an insertion section which extends a certain length from the head section and has an elastic spring wound on an outer surface thereof, with a step formed at the junction between the head section and the insertion section.

On the handle of the body, there are provided an outer groove, a through hole and an inner groove. The head section of the shutter enters the outer groove by pressure from the trigger; the insertion section of the shutter passes through the through hole to communicate with the first vacuum line; and the free end of the insertion section fits into the inner groove by the pressure from the trigger.

The tweezer comprises a body having a first vacuum line with an opening/closing means for opening/closing the first vacuum line, and a head for adsorbing the wafer by a second vacuum line, and further comprises a connecting means for connecting the body and the head, and for preventing the body and the head from rotating relative to each other due to the weight of a wafer adsorbed off-center.

The connecting means comprises a connecting part extending from the end of the head such that a step is formed at a junction between the end of the head and the connecting part, and the second vacuum line extends through the connecting part. The connecting means also comprises a connection groove which is formed on the end of the body, such that the first vacuum line of the body passes through the connection groove. The connecting part has an outer shape which corresponds to the inner shape of the connection groove, such that the connecting part is nonrotatably inserted into the connection groove.

The outer shape of the connecting part and the inner shape of its corresponding connection groove are polygonal, for example shaped as a triangle, quadrangle, pentagon, etc., or as an oval. Alternatively, the connecting part and connection groove may have matching protrusions and protrusion grooves that fit together non-rotatably.

Alternatively, the connecting part may be provided on the end of the body, and the connection groove may be provided on the end of the head, with the two fitting together non-rotatably as described above.

A protruded connecting part extends from an end of the connecting part, with a step formed at the junction between them, and the second vacuum line extends through the protruded connecting part, such that when the head is connected to the body, the protruding connecting part is inserted into the vacuum line, wherein an O-ring is installed to maintain a seal between them.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention in which.

DETAILED DESCRIPTION OF PREFERRED ENBODIMENTS

Figure 1:
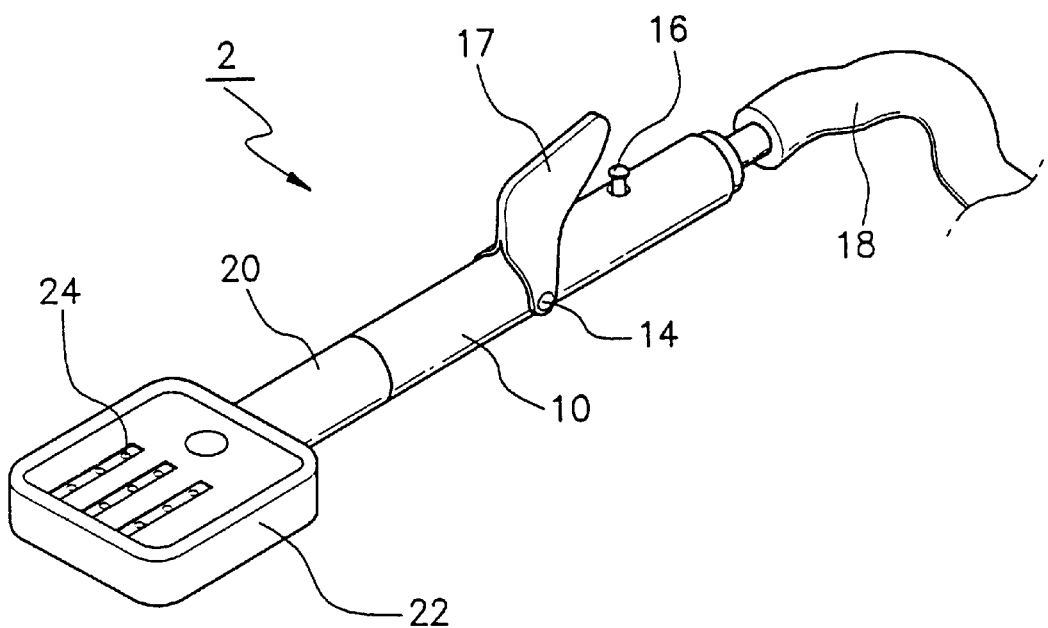
FIG. 1 is a perspective view showing a conventional tweezer for adsorbing a semiconductor wafer.
Figure 2:
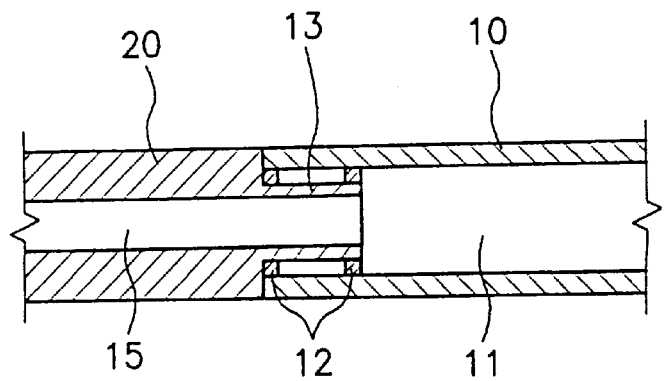
FIG. 2 is a cross-sectional view showing the connection of the neck of the head to the body of the conventional tweezer for adsorbing a semiconductor wafer.
Figure 3A:
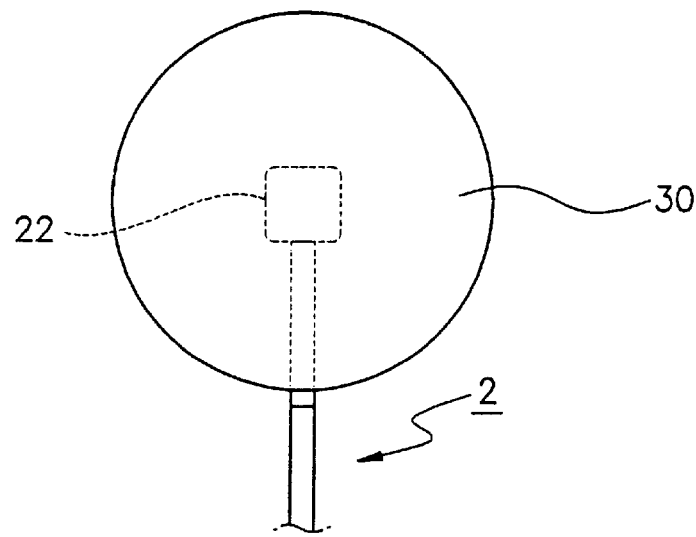
FIG. 3a shows the conventional tweezer for adsorbing a semiconductor wafer used in a normal state.
Figure 3B:
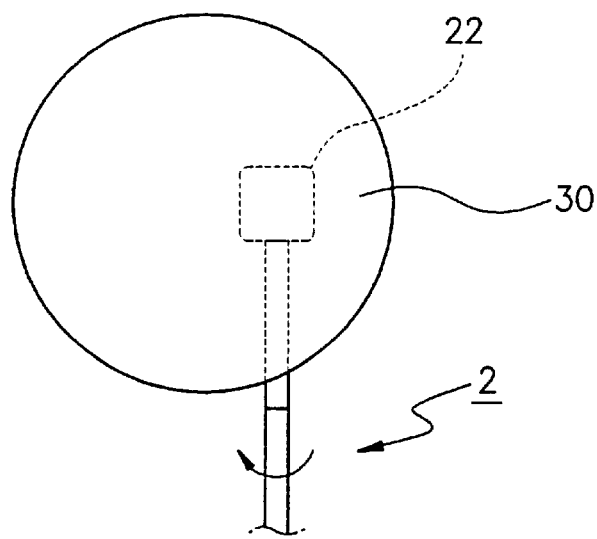
FIGS. 3b and 3c show the conventional tweezer for adsorbing a semiconductor wafer used in an abnormal state.
Figure 3C:
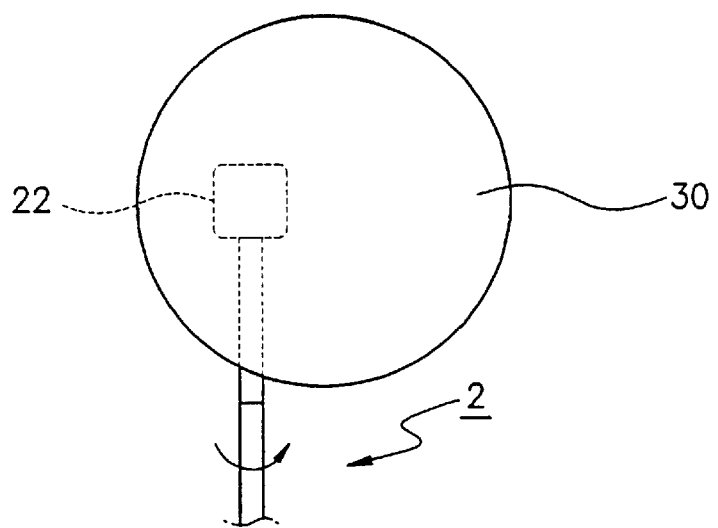
Figure 4:
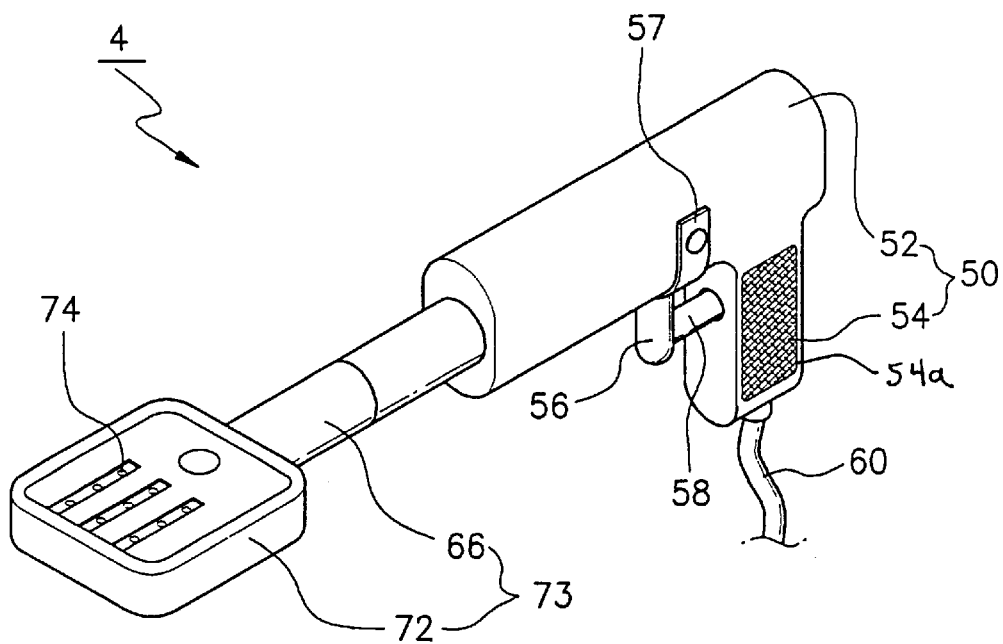
FIG. 4 is a perspective view showing a tweezer for adsorbing a semiconductor wafer according to one embodiment of the present invention.

Reference will now be made in detail to preferred embodiments of the present invention, examples of which are illustrated in the accompanying drawings.

A tweezer 4 for adsorbing a semiconductor wafer according to the present invention, as shown in FIGS. 4, 5, 6 and 7 comprises a body 50 and a head 73, which are connected to each other. The body 50 is gun-shaped and comprises a barrel 52 and a handle 54; and the head 73 comprises a neck 66 and a pad 72. A vacuum hose 60 extends from the lower part of the handle 54 of the body 50, to connect the body 50 to a vacuum source (not shown). The vacuum hose 60 is connected to a first vacuum line 51 inside the body 50. The first vacuum line 51 and a second vacuum line 67 inside the neck 66 are in communication with each other. The second vacuum line 67 is connected to a space (not shown) inside the pad 72. A plurality of vacuum holes 74 are provided on the top of the pad 72.

In addition, on the outer surface of the handle 54, as shown in the drawing, there are provided a plurality of slip-prevention protrusions 54a, the protrusions 54a forming a textured grip surface on the handle 54.

On a lower side of the barrel 52 of the body 50, there is provided a trigger 56, which is movably fixed by a fixing member 57, and a shutter 58 for opening/closing the first vacuum line 51 inside the body 50 by means of the pressure on the trigger 56. The shutter 58 is connected to the trigger 56.

Figure 5:
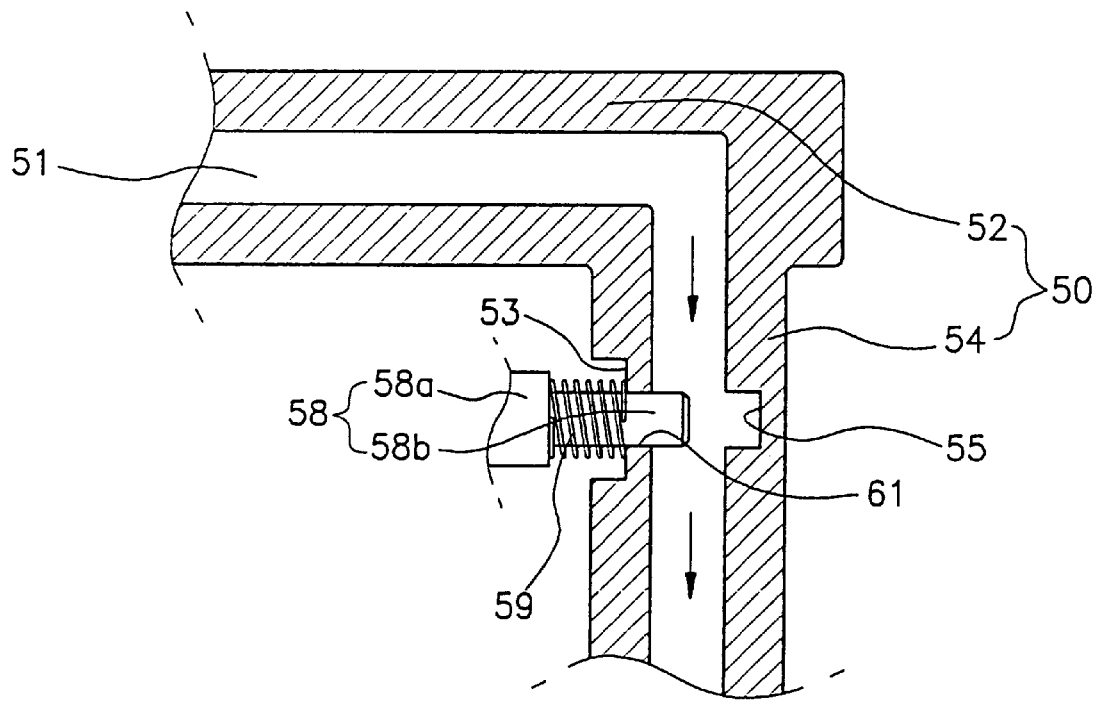
FIG. 5 is an enlarged sectional view showing the opening/closing of the first vacuum line inside the body of the tweezer for adsorbing a semiconductor wafer according to the present invention.

The shutter 58 comprises, as shown in FIG. 5, a head section 58a connected to the trigger 56, and an insertion section 58b extended from the head section 58a, with a step formed at the junction between the two sections. Around the outer surface of the insertion section 58b, an elastic spring 59 is wound. On a certain portion of the handle 54 of the body 50, there is provided an outer groove 53, and the head section 58a of the shutter 58 enters the outer groove 53 when the trigger 56 applies pressure to the shutter 58. A through hole 61 is provided in the base of the outer groove 53 for allowing the insertion section 58b to pass through the handle 54 so as to communicate with the first vacuum line 51 inside the handle. In addition, there is provided an inner groove 55 inside the first vacuum line 51 facing the insertion section 58b of the shutter 58, so that the free end of the insertion section 58b passes across the first vacuum line 51 and enters the inner groove 55 when the trigger 56 is pressed.

Figure 6:
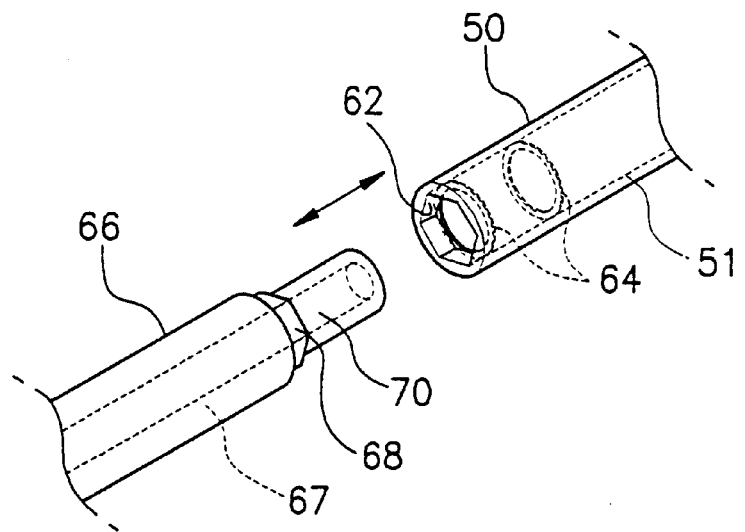
FIG. 6 is an exploded perspective view showing the connection of the neck of the head to the body of the tweezer for adsorbing a semiconductor wafer according to the present invention.
Figure 7:
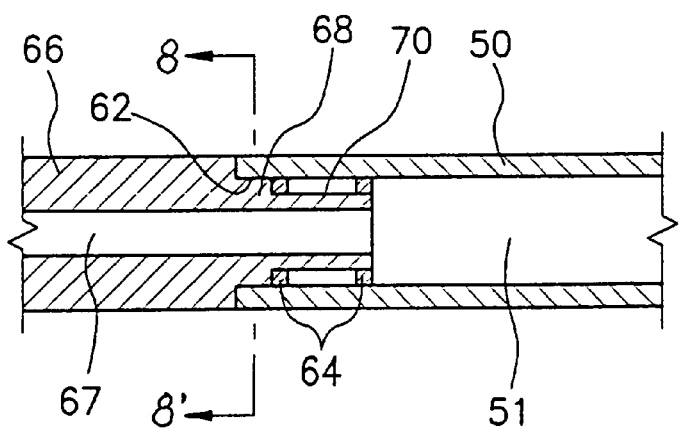
FIG. 7 is a cross-sectional view taken along the centerline of the connection shown in FIG. 6.
Figure 8:
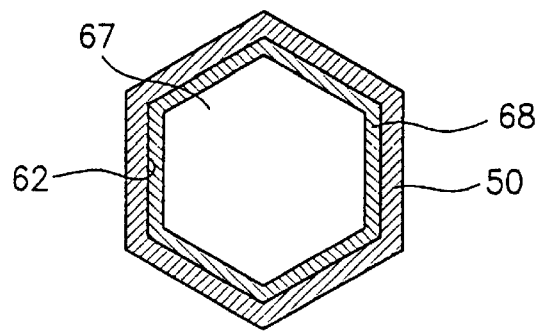
FIG. 8 is a cross-sectional view taken along the line 8–8' in FIG. 7.

Inside the neck 66 of the head 73 and the body 50, as shown in FIGS. 6, 7, and 8, there is provided the second vacuum line 67. A connecting part 68 is formed extended from the end of the neck 66, with a step formed at the junction between them. The outer surface of the connecting part 68 has a hexagonal shape, and a connection groove 62 is provided on the end of the body 50 including the first vacuum line 51 therein. The outer surface of the connection groove 62 has a hexagonal shape identical to the shape of the outer surface of the connecting part 68 such that the connecting part 68 fits into the connection groove 62.

Also, a protruded connecting part 70 is formed extended from the connecting part 68, with a step formed at the junction between them, and the second vacuum line 67 extending through the protruded connecting part 70. In addition, there are provided two O-rings 64 inside the first vacuum line 51 close to the connection groove 62 of the body 50. The two O-rings 64 are spaced a certain distance away from each other so as to maintain a seal between the inner surface of the first vacuum line 51 and the outer surface of the protruded connecting part 70, which is inserted into the first vacuum line 51.

Figure 9:
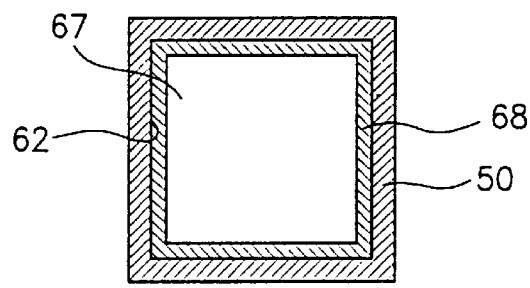
FIGS. 9 to 13 are cross-sectional views of other embodiments of the connection shown in FIG. 8.
Figure 10:
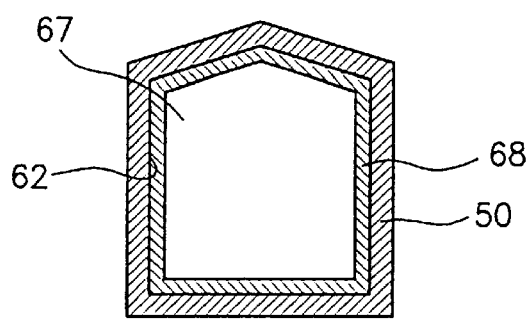
Figure 11:
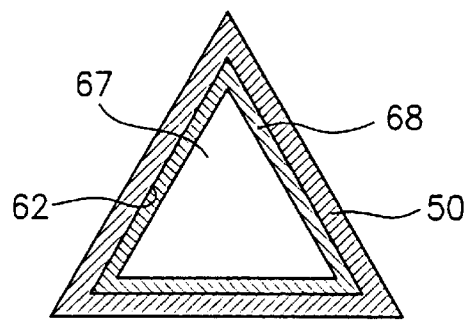

The outer surface of the connecting part 68 can be made with various polygonal shapes other than the hexagon shown in FIG. 8, e.g., quadrangle, pentagon, triangle, etc., as shown in FIGS. 9, 10 and 11. By making the connection groove 62 on the end of the body 50 a polygonal shape identical to the outer surface of the connecting part 68, and inserting the connecting part 68 into the connection groove 62, the neck 66 of the head 73 and the body 50 can be connected to each other.

Figure 12:
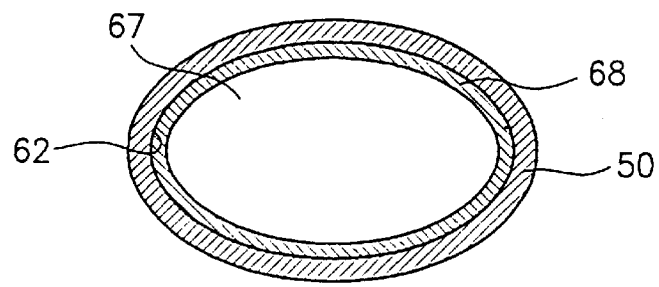

Alternatively, the outer surface of the connecting part 68, as shown in FIG. 12, can be formed as an oval shape, and the connection groove 62 having a same shape as the outer surface of the connecting part 68 is formed on the end of the body 50, so that when the connecting part 68 is inserted into the connection groove 62 the neck 66 of the head 73 and the body 50 can be connected.

Figure 13:
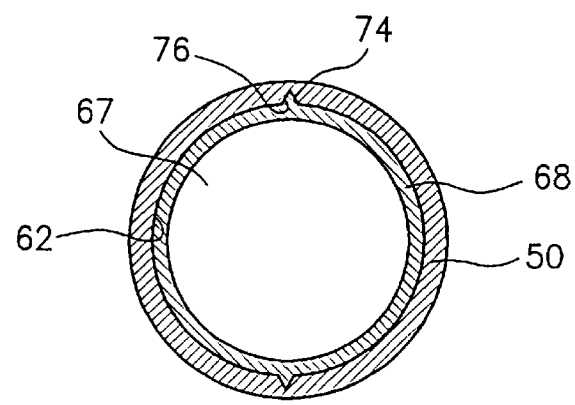

Or, the outer surface of the connecting part 68, as shown in FIG. 13, can be positive-engraved providing a protrusion 74. Then, a connection groove 62 is formed on the end of the body 50, which is negative-engraved to provide a protrusion groove 76 having the same shape as that of the protrusion 74. The connecting part 68 is inserted into the connection groove 62, and therefore, the neck 66 of the head 73 and the body 50 can be connected to each other.

Similarly, the outer surface of the connecting part 68 can be negative-engraved as a protrusion groove 76, and the end of the body can be positive-engraved as a protrusion 74 having the same shape as the protrusion groove 76.

In a further embodiment of the present invention (not shown), the locations of the connecting part 68 and the connection groove 62 can be reversed, such that the connecting part 68 is formed on the end of the body 50, and the connection groove 62, into which the connecting part 68 is inserted, is formed on the end of the neck 66 of the head 73. In this case, the protruded connecting part 70 extends from the connecting part 68 so that the first vacuum line 51 is provided therein, and the protruded connecting part 70 is inserted into the second vacuum line 67 of the neck 66.

In any case, with the pumping operation of the vacuum source, a vacuum is formed in the vacuum hose 60 and first vacuum line 51 connected to the vacuum hose 60 inside the body 50, second vacuum line 67 inside the neck 66 connected to the first vacuum line 51, and the space inside the pad 72 connected to the second vacuum line 67. Then, the operator holds the handle 54 of the body 50 of the tweezer 4 connected to the vacuum source, and brings the pad 72 close to a wafer. Since the handle 54 has the slip-prevention protrusions 54a formed thereon, the handle 54 will not slip out of the operator's hands even if there is moisture on the handle 54.

Accordingly, the air around the pad 72 is pumped out via vacuum holes 74 of the pad 72, the second vacuum line 67, the first vacuum line 51, and the vacuum hose 60; and the wafer is adsorbed on the pad 72. At this point, even if the wafer is adhered on the pad 72 off-center, any rotation of the head 73 of the tweezer 4 due to the weight of the wafer is prevented, because the head 73 and the body 50 are connected by the insertion of the connecting part 68 into the body 50, wherein the outer surface of the connecting part 68 has a polygonal or oval shape, or is provided with protrusions and protrusion grooves, and is inserted into the corresponding connection groove 62 on the end of the body 50, as shown in FIGS. 6 and 8.

Further, since the protruded connecting part 70 extends from and forms a step with the end of the connecting part 68, and is fit-inserted into the vacuum line 51 of the body 50, there are provided two O-rings 64 inside the first vacuum line 51 of the body 50, such that a seal is maintained between the first vacuum line 51 and the protruded connecting part 70.

At this point, the operator examines the wafer while it is held on the pad 72 of the tweezer 4, and analyzes the wafer for any defects.

Then, the operator moves the pad 72 of the tweezer 4 having the wafer attached thereon to a certain location over a cassette, and presses the trigger 56 with his index finger.

Accordingly, the insertion section 58b of the shutter 58, which passes through the through hole 61 inside the outer groove 53, closes the first vacuum line 51, and the free end of the insertion section is inserted into the inner groove 55. Therefore, the wafer, which was adsorbed on the pad 72, is detached from the pad 72, and is placed into the cassette.

Then, the trigger 56 is released, and the shutter 58 retracts from the inner groove 55 by the resilient force of the spring 59 wound around the insertion section 58b, so that the first vacuum line 51 is open again.

According to the present invention as described above, the rotation of the head of the tweezer adsorbing a wafer, due to the weight of an off-center wafer, is prevented by preventing the body of the tweezer and the neck from rotating relative to each other. Therefore, the operator can handle the wafer more easily, and analyze the defects present on the wafer more easily. Further, the wafer is not broken due to premature detachment from the pad.

In addition, since the body of the tweezer of the present invention is made in a gun-shape, the operator can handle the wafer more easily by holding the handle of the body of the tweezer, especially in the case of large-diameter wafers.

Various modifications of the disclosed embodiment as well as other embodiments of the invention will become apparent to persons skilled in the art upon reference to the description of the invention. It is intended that all such modifications which fall within the true scope of this invention be included within the terms of the appended claims.

What is claimed is:

1. A tweezer for adsorbing a semiconductor wafer comprising:
   a body comprising
      a handle;
      a first vacuum line provided in the handle;
      a barrel connected to the handle, the first vacuum line extending through the barrel;
      an opening/closing means for selectively opening/closing the first vacuum line, wherein the opening/closing means comprises a trigger which is movably fixed at a lower side of the barrel by means of a fixing member and a shutter for opening/closing the first vacuum line by pressure from the trigger, the shutter comprising a head section and an insertion section which extends from the head section such that a step is formed at a junction between the head section and the insertion section;

an outer groove formed in the handle, such that the head section of the shutter enters the outer groove by pressure from the trigger;

a through hole formed in the handle at a base of the outer groove, such that the insertion section of the shutter fits into the through hole to communicate with the first vacuum line;

an inner groove provided inside the handle facing the through hole, such that a free end of the insertion section of the shutter crosses the first vacuum line and enters the inner groove by pressure from the trigger so as to block the first vacuum line, and exits the inner groove by release of pressure from the trigger so as to unblock the first vacuum line; and a head connected to the barrel for adsorbing a wafer by vacuum.

2. The tweezer for adsorbing a semiconductor wafer according to claim 1, wherein a plurality of slip-prevention protrusions are provided on an outer surface of the handle.

3. The tweezer for adsorbing a semiconductor wafer according to claim 1, wherein the insertion section of the shutter has an elastic spring wound on an outer surface thereof.

4. The tweezer for adsorbing a semiconductor wafer according to claim 1, wherein the head has a second vacuum line therein into which vacuum is supplied from the first vacuum line, and a connecting means is provided for non-rotatably connecting the body to the head, such that when a wafer is adsorbed off-center on the head, the body and the head do not rotate relative to each other due to weight of the off-center wafer.

5. The tweezer for adsorbing a semiconductor wafer according to claim 4, wherein the connecting means comprises:

a connecting part extending from an end of the head, such that a step is formed at a junction between the end of the head and the connecting part, the second vacuum line extending through the connecting part, and the connecting part having an outer shape; and a connection groove formed on an end of the body, such that the first vacuum line passes through the connection groove, and the connection groove having an inner shape corresponding to the outer shape of the connecting part, wherein the connecting part is non-rotatably inserted into the connection groove.

6. The tweezer for adsorbing a semiconductor wafer according to claim 5, wherein the outer shape of the connecting part and the inner shape of the connection groove are polygonal.

7. The tweezer for adsorbing a semiconductor wafer according to claim 5, wherein the outer shape of the connecting part and the inner shape of the connection groove are positive-engraved to form protrusions and negative-engraved to form protrusion grooves, respectively, wherein the protrusions fit into the protrusion grooves such that the connecting part is non-rotatably inserted into the connection groove.

8. The tweezer for adsorbing a semiconductor wafer according to claim 5, wherein a protruded connecting part extends from an end of the connecting part with a step formed at a junction between them, and the second vacuum line extends through the protruded connecting part, such that when the head is connected to the body, the protruded connecting part is inserted into the first vacuum line.

9. The tweezer for adsorbing a semiconductor wafer according to claim 8, wherein an O-ring is installed to maintain a seal between an outer surface of the protruded connecting part and an inner surface of the first vacuum line.

10. The tweezer for adsorbing a semiconductor wafer according to claim 5, wherein the outer shape of the connecting part and the inner shape of the connection groove are oval.

11. The tweezer for adsorbing a semiconductor wafer according to claim 5, wherein the outer shape of the connecting part and the inner shape of the connection groove are negative engraved and positive-engraved, respectively, wherein the protrusions fit into the protrusion grooves such that the connecting part is non-rotatably inserted into the connection groove.

12. The tweezer for adsorbing a semiconductor wafer according to claim 4, wherein the connecting means comprises:

a connecting part extending from an end of the body, such that a step is formed at a junction between the end of the body and the connecting part, the first vacuum line extending through the connecting part, and the connecting part having an outer shape; and a connection groove formed on an end of the head, such that the second vacuum line passes through the connection groove, and the connection groove having an inner shape corresponding to the outer shape of the connecting part, wherein the connecting part is non-rotatably inserted into the connection groove.

13. The tweezer for adsorbing a semiconductor wafer according to claim 12, wherein a protruded connecting part extends from an end of the connecting part with a step formed at a junction between them, and the first vacuum line extends through the protruded connecting part, such that when the head is connected to the body, the protruded connecting part is inserted into the second vacuum line.

* * * * *